(12) United States Patent
Schlager et al.

(10) Patent No.: US 8,653,903 B2
(45) Date of Patent: Feb. 18, 2014

(54) PASSIVE AMPLIFIER

(75) Inventors: Kenneth J. Schlager, Hartland, WI (US); Jason Zehrung, Milwaukee, WI (US)

(73) Assignee: HierComm, Inc., Hartland, WI (US)

( * ) Notice: Subject to any disclaimer, the term of this patent is extended or adjusted under 35 U.S.C. 154(b) by 108 days.

(21) Appl. No.: 13/362,069

(22) Filed: Jan. 31, 2012

(65) Prior Publication Data

US 2012/0194269 A1    Aug. 2, 2012

Related U.S. Application Data

(60) Provisional application No. 61/438,469, filed on Feb. 1, 2011.

(51) Int. Cl.
*H03H 7/00* (2006.01)
*H03H 7/06* (2006.01)
*H03H 5/02* (2006.01)

(52) U.S. Cl.
USPC ........................................ 333/24 R; 333/172

(58) Field of Classification Search
USPC ........................................ 333/172, 24 R, 185
See application file for complete search history.

(56) References Cited

U.S. PATENT DOCUMENTS

| | | | |
|---|---|---|---|
| 6,611,176 B1 * | 8/2003 | Goldman | 331/17 |
| 7,528,795 B2 | 5/2009 | Schlager et al. | |
| 7,719,380 B2 * | 5/2010 | Yetter et al. | 333/24 R |
| 8,154,362 B2 * | 4/2012 | Allen | 333/168 |
| 8,212,570 B1 * | 7/2012 | Farrow | 324/509 |
| 2009/0206808 A1 * | 8/2009 | Wrathall | 323/282 |

* cited by examiner

*Primary Examiner* — Dean O Takaoka
*Assistant Examiner* — Alan Wong
(74) *Attorney, Agent, or Firm* — Andrus Intellectual Property Law, LLP

(57) ABSTRACT

A passive amplifier for use with enhanced power supplies, signal preamplifiers and power amplifiers in communications systems particularly in mobile phones, laptop computers and other battery-powered and battery-limited devices. The passive amplifier can be used as an attachment to electric appliances or other power consuming equipment to significantly reduce the electric power requirements of such equipment. These passive amplifiers do not require an outside source of power and can be used to elevate battery power outputs and serve as either low noise signal preamplifiers or transmit power amplifiers for higher performance and extended battery life. Passive amplifier technology is either electromagnetic or dielectric in nature with component parts limited to inductive, capacitive and resistive components. Dielectric amplifier prototypes have gain values in the range of the 10 dB level so as to be useful in communications applications and power amplification.

15 Claims, 3 Drawing Sheets

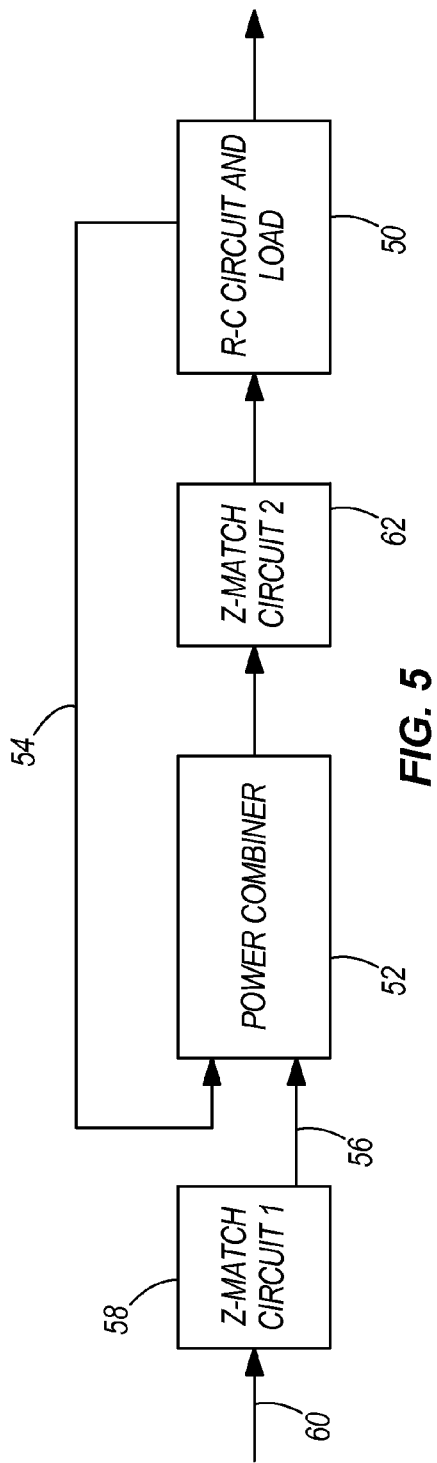
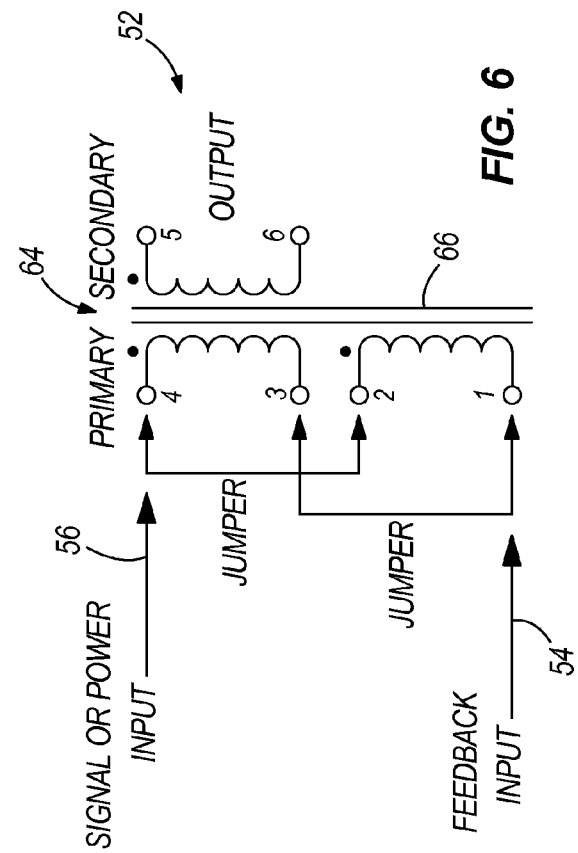

PASSIVE AMPLIFIER

CROSS-REFERENCE TO RELATED APPLICATION

The present application is based on and claims priority to U.S. Provisional Patent Application Ser. No. 61/438,469 filed Feb. 1, 2011.

BACKGROUND

Wireless communications systems have been deployed by several companies, such as HierComm, Inc., in the 5 GHz band and are currently operating profitably and growing. A companion 4.9 GHz band wireless public safety network with both mobile and fixed capabilities has also been recently deployed and is in operation. One type of low noise signal preamplifier has been used to great effectiveness and is the basis for an issued US patent, High Gain Antenna and Magnetic Preamplifier, U.S. Pat. No. 7,528,795 B2, May 5, 2009, the disclosure of which is incorporated herein by reference.

Despite the early success of the above broadband commercial and public safety networks, it has become clear that further growth in performance and cost effectiveness depended on the development of better low noise preamplifiers that would further increase radio range by improving the sensitivity of radio receivers. In mobile battery power source dependent applications, the need for low power usage amplifiers was particularly important to extend battery life. Work on a magnetic low noise amplifier led to the patent referenced above. The work described above to provide a low power usage amplifier also led to the dielectric amplifier technology of the present disclosure.

Although the low power usage amplifier was initially proposed for communications applications as described above, a second major market exists in the electric power (energy) saving market. The same passive dielectric amplifier may be designed for operation in the 60 Hz frequency band and used to save energy through attachment to electric power consuming appliances, such as refrigerators, electric heaters and lighting fixtures. In an embodiment of an amplifier with demonstrated power gains of 4 to 1, a 500 watt appliance with an attached passive dielectric amplifier would consume only 125 watts.

SUMMARY

The present disclosure relates to passive amplifiers for application as energy saving power supplies, signal preamplifiers and power amplifiers in communications systems particularly in mobile phones, laptop computers and other battery-powered and battery-limited devices. The passive amplifiers also have application as an energy saving attachment to an electric appliance These passive amplifiers do not require an outside source of power and can be used to elevate battery power outputs and serve as either low noise signal preamplifiers or transmit power amplifiers for higher performance and extended battery life.

Passive amplifier technology as proposed here is either electromagnetic or dielectric in nature with component parts limited to inductive, capacitive and resistive components. Dielectric passive amplifiers are particularly desirable because of their easier extension to higher frequency RF and microwave communications and their potential for miniaturization. The basic dielectric amplifier technology has been proven theoretically and by simulation and bench experimentation. The dielectric amplifier prototypes developed in accordance with the present disclosure are able to increase the gain of the amplifier to at least the 10 dB level so as to be useful in communications applications.

Currently, the basic dielectric amplifier function of the disclosure has been verified theoretically and by follow-on simulation and bench experimentation. Single stage prototypes were designed, constructed and tested at 60 Hz and 100 kHz. Simulation studies have been carried out at 100 kHz, 915 MHz and 2.4 GHz. Paper designs have been completed up to 5.8 GHz. In each case, the dielectric amplifier has demonstrated significant power gain without the need for an outside power source. The only requirement is an input signal in communications applications or a lower power input in electric appliance applications.

Various other features, objects and advantages of the invention will be made apparent from the following description taken together with the drawings.

BRIEF DESCRIPTION OF THE DRAWINGS

The drawings illustrate the best mode presently contemplated of carrying out the disclosure. In the drawings:

FIG. 5 is a schematic illustration including the dielectric amplifier in a positive feedback circuit; and FIG. 6 is a circuit diagram of a power combiner.

DETAILED DESCRIPTION

Figure 1:
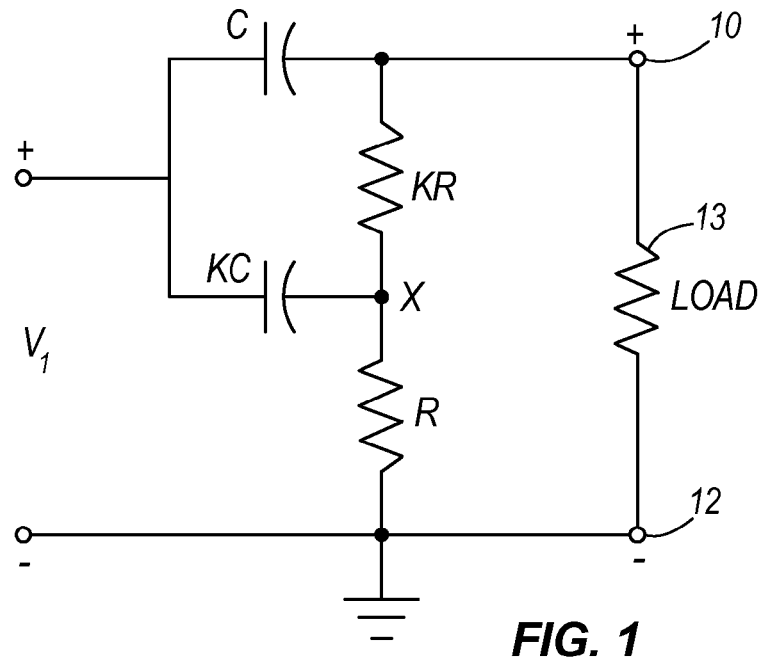
FIG. 1 is a circuit schematic of a prior art passive voltage amplifier.

The original concept of a dielectric passive amplifier was derived from a reference in a text, *The Science of Radio*, by Professor Paul J. Nahin of the University of New Hampshire [Nahin 2001]. In the referenced article, the article describes a circuit that provides a voltage gain greater than unity made up of only passive resistor and capacitor components, as illustrated in FIG. 1. A mathematical proof and a voltage gain formula for the circuit shown in FIG. 1 are also provided along with an Electronics Workbench simulation in the referenced text. An example circuit with an input voltage at 1.882 GHz is displayed in the text and test results shown. A typical maximum voltage gain for the circuit of FIG. 1 of 1.15 is recorded. A fatal weakness of the Nahin circuit shown in FIG. 1 is its inability to drive a typical 50 ohm (or 75 ohm) communications load 13 connected across terminals 10 and 12. When an external 50 ohm load 13 is applied across terminals 10 and 12, the voltage gain disappears and becomes a loss. The circuit also is mismatched with a typical 50 ohm communications source. The present disclosure has solved both of these problems by integrating a 50 ohm resistor and an input impedance (Z) matching circuit into the circuit design. With this change, the dielectric circuit element is able to provide 50 ohm impedance matching on both the input and output of the circuit element.

Figure 2:
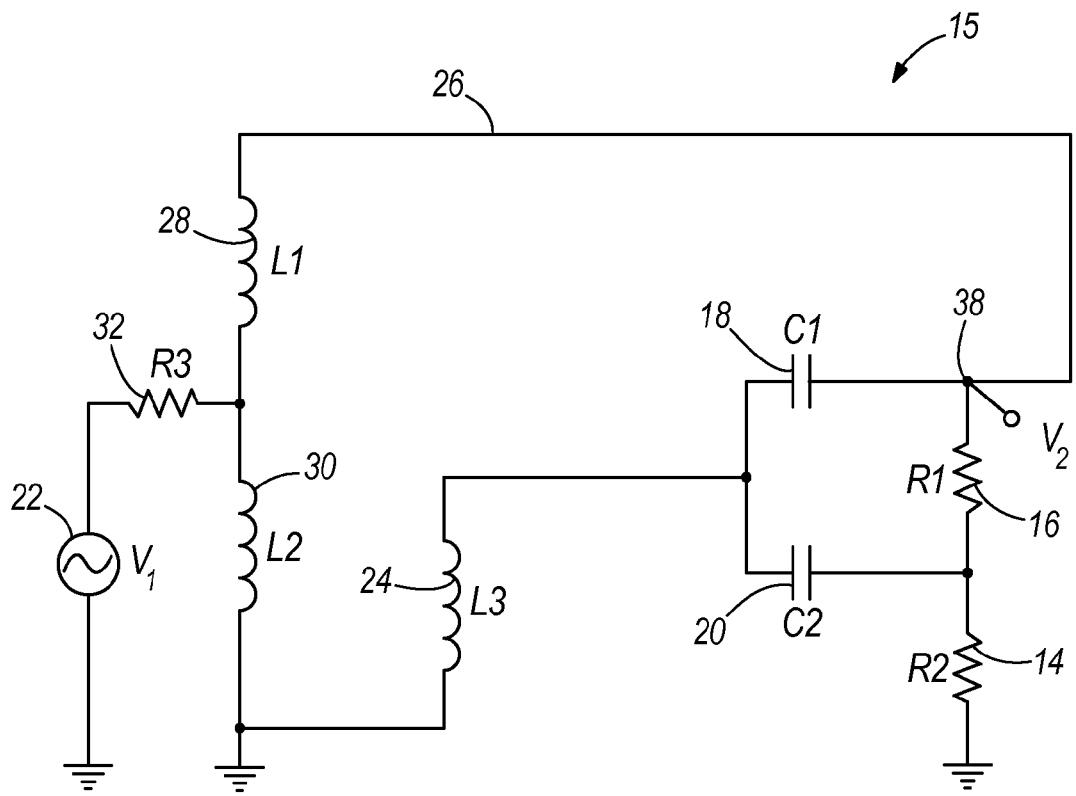
FIG. 2 is a circuit schematic of a passive amplifier of the present disclosure that incorporates the load and positive feedback into the amplification circuit.

FIG. 2 illustrates the circuit schematic of a first embodiment of a passive dielectric amplifier 15 of the present disclosure. As illustrated in FIG. 2, a load resistance 14 is included as part of the circuit and forms part of the voltage divider including the resistor 16. Unlike the embodiment shown in FIG. 1, the load resistance 14 forms part of the voltage divider rather than being connected across the terminals 10 and 12 shown in FIG. 1. In the embodiment shown in FIG. 2, the load resistor 14 is a 28 ohm resistor to serve a 500 watt, 120 volt load in an appliance energy saving application while the resistor 16 is a 1200 ohm resistor.

A pair of capacitors 18, 20 are connected to voltage source 22 through an inductor 24. Positive feedback is created through feedback line 26 which is connected to inductor 28 that forms part of a divider network with inductor 30. The voltage source 22 is connected to the junction between the inductors 28 and 30 through resistor 32. By incorporating the resistive load 14 directly into the circuit rather than connecting the resistive load across an output terminal, the passive amplifier of the present disclosure allows the load to be driven unlike the prior embodiment disclosed in FIG. 1.

Figure 3:
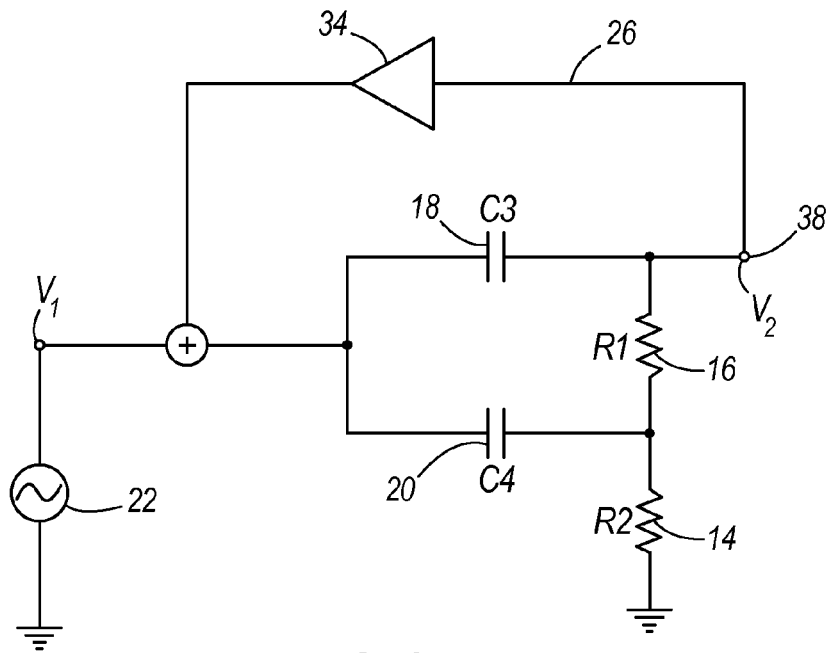
FIG. 3 is a simulation circuit for the circuit diagram of FIG. 2.

FIG. 3 illustrates an alternate embodiment of the passive amplification circuit of FIG. 2. The embodiment shown in FIG. 3 is meant for simulation purposes only and includes an operational amplifier 34 contained in the feedback network. Since the operational amplifier 34 requires power to operate, it is clear that the circuit in FIG. 3 is for simulation purposes only and is not meant to be a circuit implemented as part of a functioning amplifier. Similar components are referred to by common reference numerals with respect to FIGS. 2 and 3. In the embodiment of FIG. 3, the operational amplifier 34 is positioned between the feedback line 26 and the voltage source 22.

Figure 4:
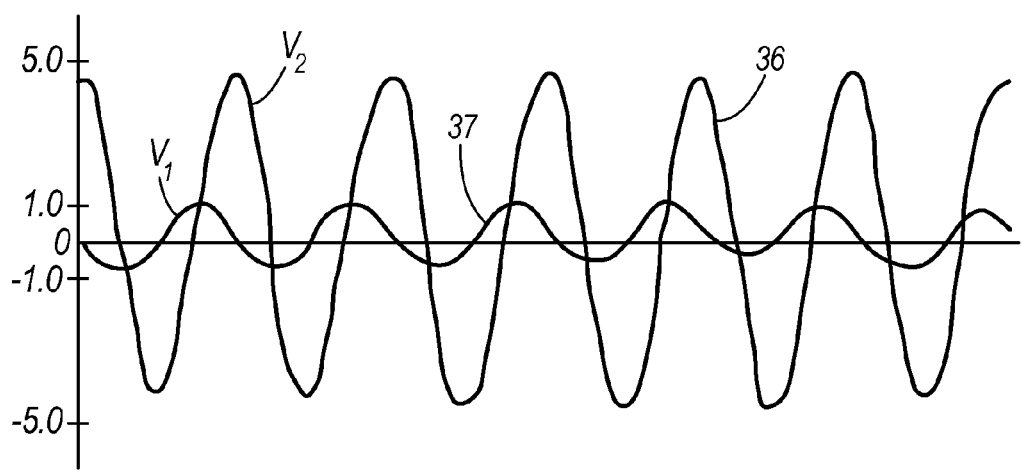
FIG. 4 is a graphic illustration of the input and output voltage source illustrating the amplification of the signal by the passive amplifier of the present disclosure.

FIG. 4 illustrates the simulation output of the schematic circuit illustration of FIG. 3, As can be seen in FIG. 4, the output 36 across the resistance 14 is amplified relative to the voltage input signal 37. The output signal 36 is recorded at the output terminal 38 of FIG. 3 while the input signal 37 is right from the 60 Hz voltage source 22.

By incorporating the load resistance 14 as part of the voltage divider, the amplifier of the disclosure incorporates a range of dielectric amplifier circuit elements all of which provide a voltage gain. These designs include amplifier circuits at 60 Hz, 100 kHz, 915 MHz, 2.4 GHz, 4.9 GHz and 5.8 GHz. Circuit simulations were carried out at all of these frequencies to verify the voltage gain, which is about 4.5 in the sample output of these simulations shown in FIG. 4. Thus, the amplifier circuit can be used in power supply applications with input voltages having a frequency range between 50 Hz and 500 kHz. In communication applications, the amplifier can be used with inputs having a frequency range between 500 kHz and 10 GHz.

With this verification of the dielectric circuit element design, a proposed program can be designed to enhance the voltage/current/power gain of the new dielectric amplifier to a level where it will be extremely useful in communications. It plans to accomplish this gain enhancement in two parallel complementary efforts:
1. Developing multi-stage, cascaded dielectric amplifier circuits;
2. Employing positive feedback technology to increase the voltage/power gain of a single stage dielectric amplifier circuit.

A multi-stage version of the dielectric amplifier element has promise of increasing the demonstrated 15% voltage gain and 32% power gain of a single dielectric amplifier element to a 6 dB power amplifier in a five-stage configuration. A 10-stage configuration has the potential of creating a 10.9 dB power amplifier.

The objectives of the present design are twofold:
1. Extend the current proven dielectric amplifier element technology to power gain levels of 10 dB or greater using cascaded multi-stage power amplifier configurations.
2. Extend the same dielectric technology to higher power gains for power supply enhancement using positive feedback techniques.

FIG. 5 illustrates a detailed implementation of the positive feedback version of the dielectric amplifier with an R-C circuit 50 incorporating the resistive load (R) from FIG. 1 shown as the output section of the amplifier. An output voltage from the R-C circuit 50 is fed back to a power combiner 52 along feedback line 54 as a positive input to the power combiner 52. The power combiner 52 combines this feedback with the input signal along line 56 to form a positive feedback amplifier.

An impedance matching circuit 58 is required for the input signal or power source available on input line 60 (Z-Match Circuit 1) to match the source for efficient power transfer to the amplifier. A similar impedance matching circuit (Z-Match Circuit 2) 62 is required to match the output of the power combiner 52 with the R-C circuit 50. These impedance matching circuits 50, 62 are well known highpass or lowpass (L-C) matching networks with resonance characteristics.

FIG. 6 provides a detailed circuit diagram of the power combiner 52 which is a dual primary, single secondary transformer 64 wound on a high permeability, zinc manganese ferrite toroid core 66. Zinc manganese ferrite cores 66 are useful in the frequency range 10 kHz to 500 kHz. Other ferrite or non-ferrite core materials may be used in other frequency ranges. Various core materials would also be used for a range of amplifier power levels. The transformer is wound in parallel, so that the two primary inputs are added in the secondary winding.

Technical Approach

As previously stated, appropriate parameters have been calculated to have the single stage circuit of FIG. 2 provide a 15% voltage gain and 32% power gain over a wide range of frequency bands. For amplifier application, the proposed technical approach would cascade multiple dielectric circuit elements suitably matched to avoid loading into a higher gain multi-stage amplifier. In the modified circuit configuration, the input and output impedances are essentially resistive and virtually identical in value, so that quarter-wave microstrips will provide very low loss impedance matching. Given the parameters involved, development of a cascaded element multi-stage circuit can be readily accomplished.

The technical approach employing positive feedback to enhance power gain for lower frequency power supply enhancement is more complex but easily understandable. The gain equation for a positive feedback amplifier differs significantly from the conventional negative feedback amplifier [Bode 1945].

Positive Feedback Gain
$$G = \mu/(1-\mu\beta)$$

Negative Feedback Gain
$$G = \mu/(1+\mu\beta)$$

Where
G—closed loop voltage gain
μ—forward gain
β—feedback gain

From the above, it can be shown that in a negative feedback configuration, any set of positive gain parameters will result in a reduced closed loop gain. The positive feedback is more complex. Any positive product of μβ greater than two (2.0) will also reduce gain and invert the signal. Gain enhancement is achieved with μβ product values in the range of 0.1 to 1.9. μβ product values exceeding 1.1 will invert the signal. The quantity μβ is often designated as the feedback factor. Feedback factors in the range of 0.9 to 1.1 are usually unstable. A practical range of feedback factor values is 0.5 to 0.85. Example of close loop gain values are shown below.

| μβ | Voltage Gain | Power Gain |
|---|---|---|
| 0.85 | 6.67 (8.2 dB) | 16.4 dB |
| 0.70 | 3.33 (5.2 dB) | 10.4 dB |
| 0.50 | 2.00 (3.0 dB) | 6.0 dB |

To achieve a voltage gain of 8.2 dB with a forward μ gain of 1.15 in a dielectric amplifier element, a feedback gain β of 0.74 would be required.

Positive feedback circuits are traditionally considered unstable and sometimes equivalent to oscillators. Positive feedback, however, can be a very useful technology for amplifier gain enhancement. It has been used for over 100 years in classic magnetic power control amplifiers which were pioneered by the U.S. Navy after World War II [Geyger, 1957]. While different in operating principle from classic magnetic amplifiers, currently available magnetic amplifiers still employ positive feedback circuits. It is also important to point out that analytical techniques developed for the design of negative feedback amplifiers, such as Bode plots, can also be used to insure stability in positive feedback circuits.

In the transmit power amplification, the principal advantage will be equal or higher power with little or no additional battery power consumption. In low noise figure preamplifiers, the advantage will relate to lowered receiver sensitivity resulting from the inherently quiet nature of such circuits. Battery life extension will take the form DC/AC/DC conversions since the amplifier operates only in AC. Any conversion losses will be more than compensated by the power gain of the low frequency power amplifier.

Communications Applications

Although passive dielectric amplifiers, as described here, are believed to have a wide range of communications applications, they will probably have their greatest impact on mobile Ad Hoc networks where peer-to-peer transmissions predominate, such as an Ad Hoc communications system at 4.9 GHz for public safety application. From a market size point of view, the use of the passive dielectric amplifiers will be most valuable in mobile phone networks where battery life is limited. Passive amplifier technology will improve such mobile networks by:

1. Extending transmission range with higher transmission output powers and with greatly reduced battery power consumption.
2. Extending transmission range with improved receiver sensitivity from low noise preamplifiers as described above.
3. Extending battery life through power amplification as described above.

All three of the above improvements are also targets for the passive magnetic amplifier of the present disclosure. As previously stated, however, dielectric amplifiers have much greater potential for higher frequency UHF and microwave communications and lend themselves to miniaturization for lighter weight in mobile applications. In addition to the above improvements for mobile communications devices, passive dielectric amplifiers will also be very useful in fixed remote battery-based relay stations in the new relay-based network architectures.

Aside from applications in communications, other needs for longer life power sources exist in the world of unmanned air vehicles (UAVs) and more particularly Micro Air Vehicles (MAVs) which employ rechargeable Li-ion batteries as power sources. Extension of battery life using the proposed dielectric power amplifier could greatly extend the range and operating time of such MAVs for enhanced military effectiveness.

The amplifier of the present disclosure can be used for both the transmit power amplifier and the power amplified battery power source. Both uses will be of a form suitable for portability and demonstrations at selected locations. Both the cascaded multi-stage and the positive feedback gain enhancement technologies will be employed for both objectives with the purpose of selecting which is most suitable for each application.

Other Applications

Although the passive dielectric amplifier shown in the Figures is described as being particularly useful in a wide range of communications applications, it should be understood that the amplifier could also be utilized in various other types of situations in which a fixed load is being driven by a power supply or an AC power source in a commercial building or place of residence. The dielectric amplifier shown in the drawing of FIG. 2 is a very low power consuming amplifier, which has application in almost any embodiment in which a load is driven by a battery power supply. An entire class of applications for the dielectric amplifier is available for low power consumption operating at 60 Hz.

Conclusions

Passive dielectric amplifier technology could have a profound impact on communications in the coming years. As modern communications systems become more mobile, there is a greater need for more efficient use of power sources. The most critical step in dielectric amplifier development, the proof of passive dielectric voltage amplification, has already been demonstrated theoretically, by simulation and bench experimentation. The proposed next research steps here, multi-stage amplification and positive feedback gain enhancement, while challenging have a relatively high probability of success.

We claim:

1. A passive amplifier for amplifying a voltage source, comprising:
   a voltage input terminal;
   a pair of capacitors connected in parallel to the voltage input terminal;
   a first resistor connected between the pair of capacitors;
   an output terminal connected to a first end of the first resistor;
   a load resistor connected between a second end of the first resistor and ground; and
   a positive feedback circuit connected between the output terminal and the voltage source.

2. The passive amplifier of claim 1 wherein the positive feedback circuit includes a first inductor and the passive amplifier further comprises a second inductor connected between the first inductor and the voltage input terminal, wherein the voltage source is connected to a junction between the first and second inductors.

3. The passive amplifier of claim 2 further comprising a third inductor connected between the second inductor and the voltage input terminal.

4. The passive amplifier of claim 1 wherein the feedback circuit includes only passive components.

5. The passive amplifier of claim 1 wherein the frequency of the voltage source is between 500 kHz and 10 GHz.

6. A power supply, comprising:
   a voltage source providing an AC voltage at a frequency; and
   a passive amplifier for amplifying the voltage source to create an output voltage, the passive amplifier comprising:
      a voltage input terminal;
      a pair of capacitors connected in parallel to the voltage input terminal;
      a first resistor connected between the pair of capacitors;
      an output terminal connected to a first end of the first resistor;
      a load resistor connected between a second end of the first resistor and ground; and
      a positive feedback circuit connected between the output terminal and the voltage source.

7. The power supply of claim 6 wherein the positive feedback circuit includes a first inductor and the passive amplifier further comprises a second inductor connected between the first inductor and the voltage input terminal, wherein the voltage source is connected to a junction between the first and second inductors.

8. The power supply of claim 7 further comprising a third inductor connected between the second inductor and the voltage input terminal.

9. The power supply of claim 6 wherein the feedback circuit includes only passive components.

10. The power supply of claim 6 wherein the frequency of the voltage source is between 50 Hz and 500 kHz.

11. An apparatus for amplifying a voltage source, comprising:
   a power combiner having an input terminal to receive the voltage source for amplification, a feedback terminal and an output terminal;
   a passive amplifier coupled to the output terminal of the power combiner, the passive amplifier comprising:
      a voltage input terminal;
      a pair of capacitors connected in parallel to the voltage input terminal;
      a first resistor connected between the pair of capacitors;
      an output terminal connected to a first end of the first resistor;
   a load resistor connected between a second end of the first resistor and ground; and
   a positive feedback line coupled between the output terminal of the passive amplifier and the feedback terminal of the power combiner; and
   an impedance matching circuit positioned between the output terminal of the power combiner and the voltage input terminal of the passive amplifier.

12. The apparatus of claim 11 further comprising a second input matching circuit positioned between the voltage source and the input terminal of the power combiner.

13. The apparatus of claim 11 wherein the power combiner is a transformer having a pair of primary windings and a secondary winding, wherein the input terminal is connected to one of the primary windings, the feedback terminal is connected to the other primary winding and the output terminal is connected to the secondary winding.

14. The apparatus of claim 11 wherein the frequency of the voltage source is between 50 Hz and 500 kHz.

15. The apparatus of claim 11 wherein the frequency of the voltage source is between 500 kHz and 10 GHz.

* * * * *